AUTOMATIC TUNING CIRCUIT FOR A TRANSMITTER CAVITY AMPLIFIER

Filed Dec. 19, 1961

Alfred Reich,
Dale M. Osterman,
*INVENTORS.*

BY S. J. Rotondi
A. T. Dupont
D. H. Ward

3,165,697
AUTOMATIC TUNING CIRCUIT FOR A TRANSMITTER CAVITY AMPLIFIER

Alfred Reich, Levittown, and Dale M. Osterman, Haddonfield, N.J., assignors, by mesne assignments, to the United States of America as represented by the Secretary of the Army Filed Dec. 19, 1961, Ser. No. 160,679
5 Claims. (Cl. 325—127)

Figures 1, 2:
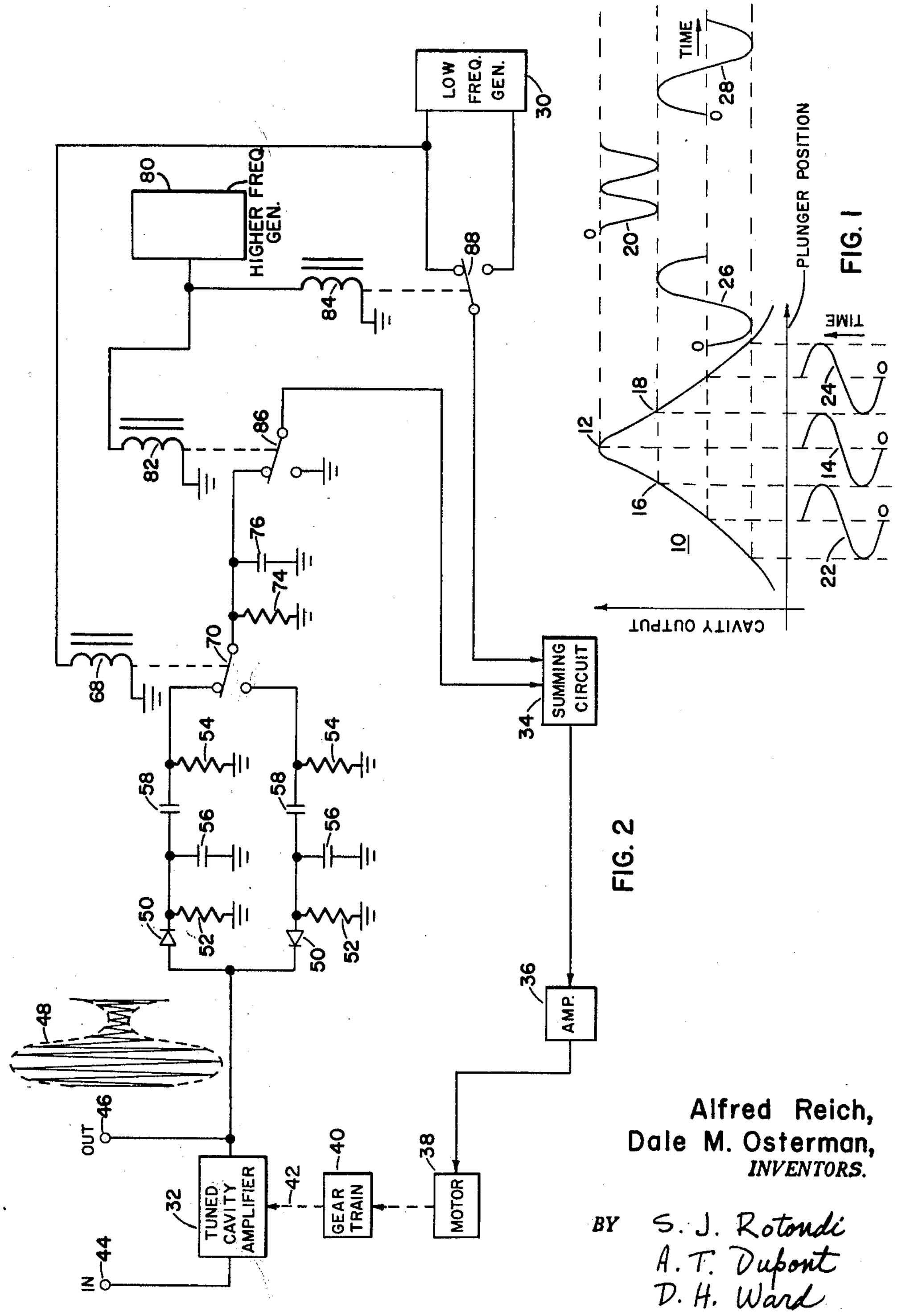

This invention relates to automatic tuning devices and more particularly to a servo mechanism for automatically tuning a cavity used as the amplifier stage of a transmitter.

Since prior automatic tuning circuits have been operated and controlled by the amplifier amplitude or frequency output, small, gradual changes in circuit parameters could not be detected. Transmitters, particularly those used in radar, have many stages of amplifiers, oscillators and frequency determining circuits which must be adjusted to tune the device for optimum output.

If the amplifier stage of a transmitter is a cavity, tunable by a movable plunger, tuning can be accomplished by shaft rotation effecting movement of the plunger. The cavity output, therefore, can be modulated by moving the plunger in a sinusoidal or back and forth motion. This modulated output, when properly conditioned and compared to the signal which controls the plunger position, will be indicative of the discrepancy in tuning and will compensate for it by moving the plunger a net displacement in one direction or the other. This can be better understood in the following description in which one object of the invention is to eliminate the problem of shutdown or "dead" time for a transmitter to facilitate tuning.

Another object of this invention is to provide a tuning device which will maintain a tuned condition in a transmitter when the parameters change either intentionally or unintentionally.

These and other objects of this invention may be more fully understood from careful consideration of the following detailed description when taken in conjunction with the accompanying drawing wherein:

FIGURE 1 illustrates a graph of plunger position versus voltage output of the tunable cavity amplifier and, FIGURE 2 is a schematic illustration of an embodiment of this invention.

Referring to FIGURE 1, curve 10 represents plunger position versus amplitude of voltage output or the tuning condition of the cavity amplifier. Each point on curve 10 therefore is representative of the output at a particular plunger position. The distance to point 12 in one direction from the reference of graph 10 is the optimum plunger position for maximum output. A sinusoidal motion of the plunger around this point will result in an output which will approach and recede from the maximum periodically. Consider the curve 14; the plunger is moved from point 12 to point 16, back to point 12, to point 18, and back to point 12 resulting in an output, modulated by the plunger position, whose positive envelope is illustrated by curve 20. The negative of curve 20 will be the negative envelope of that output. The curves 22 and 24 likewise produce outputs whose positive envelopes are illustrated by curves 26 and 28 respectively.

Referring to FIGURE 2, a low frequency generator 30 supplies a sinusoidal signal thru summing circuit 34 and amplifier 36 to motor 38 to move the plunger of cavity 32 thru gear train 40 and shaft 42. An input 44 supplies cavity 32 with the proper signal for amplification. The motion of the plunger responsive to the sinusoidal signal of generator 30 modulates the amplified signal at output 46 as illustrated by curve 48. The positive envelope of curve 48 is indicative of the motion of the plunger as explained in the discussion of FIGURE 1. The output can be any of the curves which could be derived from the graph of FIGURE 1, but the curve 48 is shown here to be the same as curve 28. In the discussion that follows it will be assumed that the output of the cavity is as that shown by curve 48 unless otherwise stated. It can be seen, by referring to both figures, that the envelope of the cavity output will be in phase with the signal of generator 30 if the average position of the plunger is past the point of maximum output, out of phase if before that point, and partly out of phase and partly in phase if at that point. It is this characteristic which results in the novelty of the device.

The modulated cavity output is fed thru two branches, each comprised of a diode 50, resistances 52 and 54, and capacitors 56 and 58. One branch receives the positive signal and the other the negative signal and each conditions the respective signals to remove first the high frequency and then the D.-C. components. The resultant signal in each branch at resistors 54 will be an alternating voltage out of phase one with the other. Generator 30 is also connected to relay 68 to control the selection of portions of each of the two signals by relay switch 70. If the output signal is in phase with the signal of generator 30, a positive signal will be detected; if out of phase, a negative signal will be detected; and if partially in phase and partially out of phase, a relative ratio of a partially positive and partially negative signal will be detected. If the output of the cavity is as shown in curve 48 a positive signal will be detected by relay switch 70. The detected signal is then filtered by resistance 74 and capacitor 76 to produce either a positive, negative or zero signal respectively. The resultant signal, if it possesses any average value of magnitude, when fed thru summing circuit 34 and amplifier 36 to motor 38 will move the average position of the plunger a net distance equal to the magnitude of the signal. A positive signal, of course, will move the plunger one way and a negative the other way. Because of the characteristics which might be desirable of motor 38, circuitry is included to modulate the signal from low frequency generator 30 by a higher frequency signal than that of generator 30 which will provide the proper signal to drive motor 38. This circuit includes a source of higher frequency applied at terminal 80, relays 82 and 84, and respective relay switches 86 and 88. The source at terminal 80 is modulated by the filtered signal at switch 86 and the signal of generator 30 at switch 88. The higher frequency modulated signals, when summed together and amplified, will drive the motor 38 to effect the position of the plunger.

It can be seen that as the plunger is moved back and forth across a point, the output of the cavity will be such that when conditioned and compared to the motion of the plunger it will move that point a distance relative to the discrepancy in tuning. It can be understood, of course, that the conditioned output is actually compared to the signal of generator 30 which is relatively the same as the back and forth motion of the plunger.

We claim:

1. In a transmitter an automatic tuning circuit comprising a cavity amplifier tunable by a moving plunger, a motor connected to said plunger, a pair of rectifying and filtering circuits connected in parallel to the output of said amplifier, a switch means disposed for alternate connection to each of said rectifying and filtering circuits, a summing circuit, a low frequency generator connected to said summing circuit, a relay connected to said generator and responsive to the output signal of said generator for operation of said switch means, and means connecting the output of said switch means to said summing circuit, and amplifier means connecting said summing circuit to said motor.

2. A tuning circuit as set forth in claim 1 wherein said means connecting the output of said switch means to said summing circuit includes a filter circuit.

3. A tuning circuit as set forth in claim 2 including modulating means connecting the output of said filter circuit to said summing circuit.

4. A tuning circuit as set forth in claim 3 including a higher frequency generator, said modulating means modulating the amplitude of the signal of said higher frequency generator with the output signal from said filter circuit.

5. A tuning circuit as set forth in claim 4 wherein a second modulating means is connected to said higher frequency generator and between said low frequency generator and said summing circuit and modulates the amplitude of the signal from said low frequency generator.

References Cited by the Examiner

UNITED STATES PATENTS

| | | | |
|---|---|---|---|
| 2,458,684 | 1/49 | Crandell | 334—26 |
| 2,462,857 | 3/49 | Ginzton et al. | 334—28 XR |
| 2,466,931 | 4/49 | Crandell | 334—26 |
| 2,518,470 | 8/50 | Haviland | 334—26 |

DAVID G. REDINBAUGH, *Primary Examiner.*

HERMAN K. SAALBACH, *Examiner.*